United States Patent [19]

Steele

[11] Patent Number: 5,309,046

[45] Date of Patent: May 3, 1994

[54] APPARATUS AND METHOD FOR PRODUCT TERM ALLOCATION IN PROGRAMMABLE LOGIC

[75] Inventor: Randy C. Steele, Folsom, Calif.

[73] Assignee: Intel Corporation, Santa Clara, Calif.

[21] Appl. No.: 954,308

[22] Filed: Sep. 30, 1992

[51] Int. Cl.$^5$ ........................................ H03K 19/173
[52] U.S. Cl. .................................................. 307/465
[58] Field of Search ..................... 307/465, 443, 465.1

[56] References Cited

U.S. PATENT DOCUMENTS

| | | | |
|---|---|---|---|
| 4,758,746 | 7/1988 | Birkner et al. ...................... | 307/465 |
| 4,878,200 | 10/1989 | Ashgar et al. .................. | 365/189.08 |
| 4,912,345 | 3/1990 | Steele et al. .......................... | 307/465 |
| 5,121,006 | 6/1992 | Pedersen .............................. | 307/465 |

*Primary Examiner*—David R. Hudspeth
*Assistant Examiner*—Jon Santamuro
*Attorney, Agent, or Firm*—Blakely, Sokoloff Taylor & Zafman

[57] ABSTRACT

In a programmable logic device having a plurality of gates capable of being programmed according to a plurality of product terms representing logic functions, an apparatus for allocating the product terms to a plurality of outputs. A first set of product terms are steerable to one of at least two outputs. A second set of product terms is permanently assigned to a predetermined output. The second set is comprised of more product terms than the first set, wherein the average number of product terms per output is low, yet a user has the flexibility of implementing logic functions requiring a relatively large number of product terms.

20 Claims, 6 Drawing Sheets

APPARATUS AND METHOD FOR PRODUCT TERM ALLOCATION IN PROGRAMMABLE LOGIC

FIELD OF THE INVENTION

The present invention pertains to the field of programmable logic devices. More particularly, the present invention relates to an allocation scheme for pooling product terms in a programmable logic device.

BACKGROUND OF THE INVENTION

Circuit designers have at their disposal, a variety of different methods of implementing their circuit designs. One method involves incorporating their designs in dedicated custom integrated circuits (ICs). The initial cost is relatively high and the turn-around time for producing a first set of these semiconductor chips is relatively long. Another method involves the implementation of application-specific integrated circuits (ASICs). Time to market for ASICs are faster, and it is easier to implement design changes. A third alternative, which enjoys growing popularity, is utilizing programmable logic devices (PLDs).

A PLD is a semiconductor chip that contains an array of gates having programmable interconnections. The gates are programmed according to the specification provided by the circuit designer, thereby resulting in the desired logic functions. The programming usually involves using a piece of hardware, known as a programmer. A programmer is typically coupled via a serial port to a microcomputer, on which some form of programmer software is run. The simplest kind of software enables a designer to select which fuses to burn. The designer decides the desired logic function, at the gate level, then lists the corresponding fuses. Other more sophisticated programmers allow designers to specify Boolean expressions or truth tables. The software handles the minimization, simulation, and programming steps automatically. This yields custom combination and even sequential logic on a PLD chip.

There are basically two variants of PLDs: programmable array logic (PALs) and programmable logic arrays (PLAs). They are available in both bipolar and CMOS construction. PALs use fusible-link (one-time-programmable), whereas PLAs use floating-gate MOS (ultraviolet or electrically erasable). The differences between them are in respect to programming flexibility. PALs are typically faster, cheaper, and easier to program, but PLAs are more flexible. Programming of both types of devices is limited by their built-in structure.

In both cases, the desired logic functions are implemented by using standard product terms (p-terms). This involves first performing an AND function on the input variables and then forming the sum of the products, usually by performing an OR function. Typically, a standard number of p-terms are input to a programmable output structure, known as a macrocell.

One disadvantage with typical prior art PLDs is that logic functions occasionally require more p-terms than the standard PLD device can accommodate. For example, a given macrocell having a maximum of 8 p-terms assigned per macrocell has great difficulty handling a complex logic function requiring up to 16 p-terms. One prior art solution was to handle the 16 p-term function in two stages. The outputs of two 8 p-term functions are first determined and later combined. The combination is then fed back as inputs. However, the downside is that speed is sacrificed. In order to get the 16 p-term wide function, the PLD has to be cycled through twice, which results in approximately twice the processing time and requiring three macrocells to be utilized.

Another prior art approach increased flexibility by incorporating more p-terms. The extra p-terms were assigned to the macrocells. Hence, the standard number of p-terms for each macrocell is increased. For example, each macrocell could be designed to handle 16 p-terms. However, this approach suffers from the fact that silicon die size is directly proportional to the number of p-terms being implemented. Unfortunately, increasing the number of p-terms directly increases the die size by a significant amount. A large die size is highly disadvantageous because less dies can be made from a given silicon wafer. This translates into higher production costs. Furthermore, as the die size becomes relatively large, there is an associated finite delay for the signals to physically propagate through the device. In other words, adding more p-terms detrimentally impacts the overall speed of the device.

Another prior art method for increasing the number of p-terms involves implementing parallel expanders. Parallel expanders have the capability of steering extra p-terms to any macrocell. The extra p-terms made available by the parallel expanders are used to augment the existing fixed number of p-terms for that particular macrocell. However, there is an incremental performance penalty (i.e., reduced speed) associated with adding p-terms via the parallel expanders. Moreover, parallel expander architecture increases the die size.

Therefore, what is needed is a PLD having a relatively low average number of p-terms which also has the capability of handling a large number of p-terms without noticeable performance degradation.

SUMMARY AND OBJECTS OF THE INVENTION

In view of the problems associated with allocating product terms in a programmable logic device, one object of the present invention is to minimize the die size of a programmable logic device by implementing a relatively low average number of product terms.

Another object of the present invention is to implement a programmable logic device having the capability of handling a logic function requiring a relatively large number of product terms. Another object of the present invention is to provide a mechanism for steering unused product terms to those other logic functions which require additional product terms.

Another object of the present invention is to minimize performance degradations.

These and other objects of the present invention are implemented in a programmable logic device employing a product term allocation scheme. Digital circuits are broken down into a series of representative logic equations. The logic equations are converted into equivalent product terms which are then summed together (i.e., sum-of-products). The programmable logic device accomplishes this by implementing an array of programmable AND gates which are coupled to an array of OR gates. The resulting sum-of-products is input to programmable macrocells.

In the currently preferred embodiment, the programmable logic device is comprised of eight configurable function blocks which are intercoupled by means of a global interconnect. Each configurable function block is comprised of a local array, ten macrocells, comparator logic, and corresponding control and clock lines. The local array is comprised of a programmable product term array (i.e., AND and OR gates) and a product term allocation circuit. A set of twelve product terms are allocated and hardwired to the first and last macrocells. There are two sets of steerable product terms associated with each of the middle eight macrocells. Each set has two product terms. In addition, each of the two end macrocells also has a set of steerable product terms.

The product term allocation circuit uses multiplexers to steer each set to its associated macrocell or to an adjacent macrocell. Each multiplexer is controlled by a bit stored in SRAM. Consequently, each of the macrocells has the option of accepting unused product terms from adjacent macrocells on an as needed basis.

Thus, in the product allocation scheme of the present invention, the average number of product terms per macrocell is kept relatively low (i.e., fourteen per the two end macrocells plus four per each of the middle eight macrocells divided by ten yields an average of six product terms per macrocell). This results in a relatively small overall die size. Yet, in those few instances where a larger number of product terms is required, a user has the flexibility of implementing up to sixteen product terms (i.e., the end macrocells have the twelve fixed product terms plus the two associated product terms and can borrow two unused product terms from their adjacent macrocell). As a result, efficiency is increased because unused product terms are available to be used in adjacent macrocells. Moreover, the time it takes the twelve pooled product terms to reach its macrocell is approximately the same time it takes for a set of product terms to be steered to its destination macrocell. Thus, performance degradation is minimized.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

A programmable logic device having an allocation scheme for pooling product terms is described. In the following description, for purposes of explanation, numerous specific details are set forth, such as the number of product terms assigned to a particular macrocell, control and clock signals, logic architecture, etc., in order to provide a thorough understanding of the present invention. It will be obvious, however, to one skilled in the art that these specific details need not be used to practice the present invention. In other instances, well-known structures and circuits have not been shown in detail in order to avoid unnecessarily obscurring the present invention.

Figure 1:
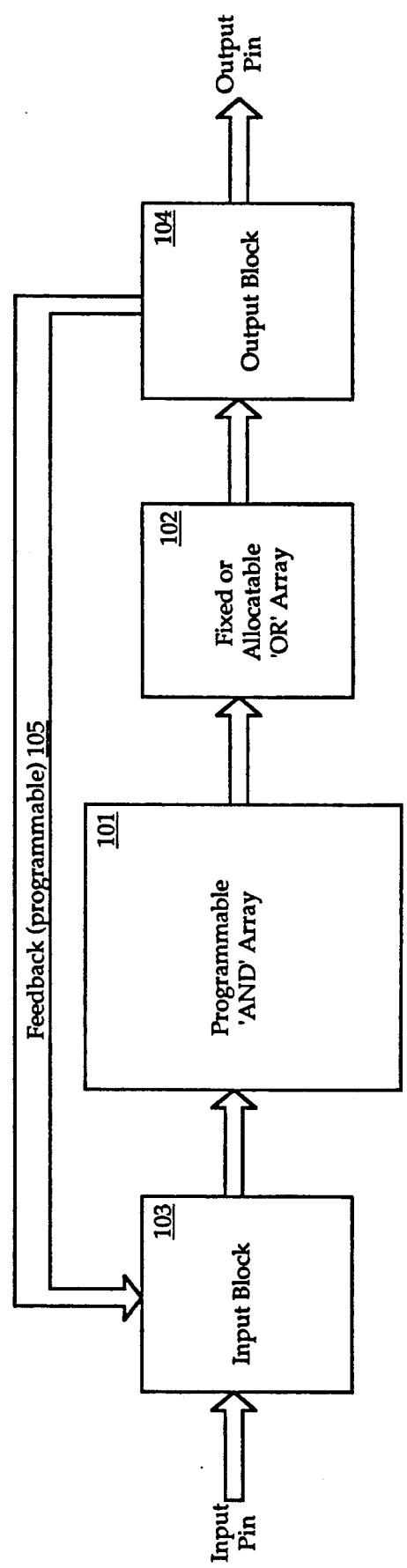
FIG. 1 is a block diagram illustrating an architecture of a typical programmable logic device.

FIG. 1 is a block diagram of the general architecture of a PLD. The PLD is internally structured as a variation of the PLA architecture—an array of programmable AND gates 101 coupled to a fixed or allocatable array of OR gates 102. PLDs make use of the fact that any logic equation can be converted to an equivalent sum-of-products (SOP) form. Hence, logic equations can be implemented in an AND/OR architecture. The basic PLA structure is augmented with input block 103 and output block 104. Input block 103 is comprised of latches and various programmable input options, and output block 104 is comprised of output controls, registers, etc. In addition, programmable feedback 105 allows a user to implement sequential logic functions as well as combination logic.

The number and location of the programmable connections between the AND and OR matrices, along with the input and output blocks, are predetermined by the architecture of the PLD. The user specifies which of these connections are to remain open and which are to be closed, depending on the logic requirements. The PLD is programmed accordingly. Programmability of these connections can be achieved using various memory technologies such as fuses, EPROM cells, EEPROM cells, or static RAM cells. Typically, a user purchases a PLD off-the-shelf and by using a development system running on a personal computer, can produce a customized integrated circuit.

Figure 2:
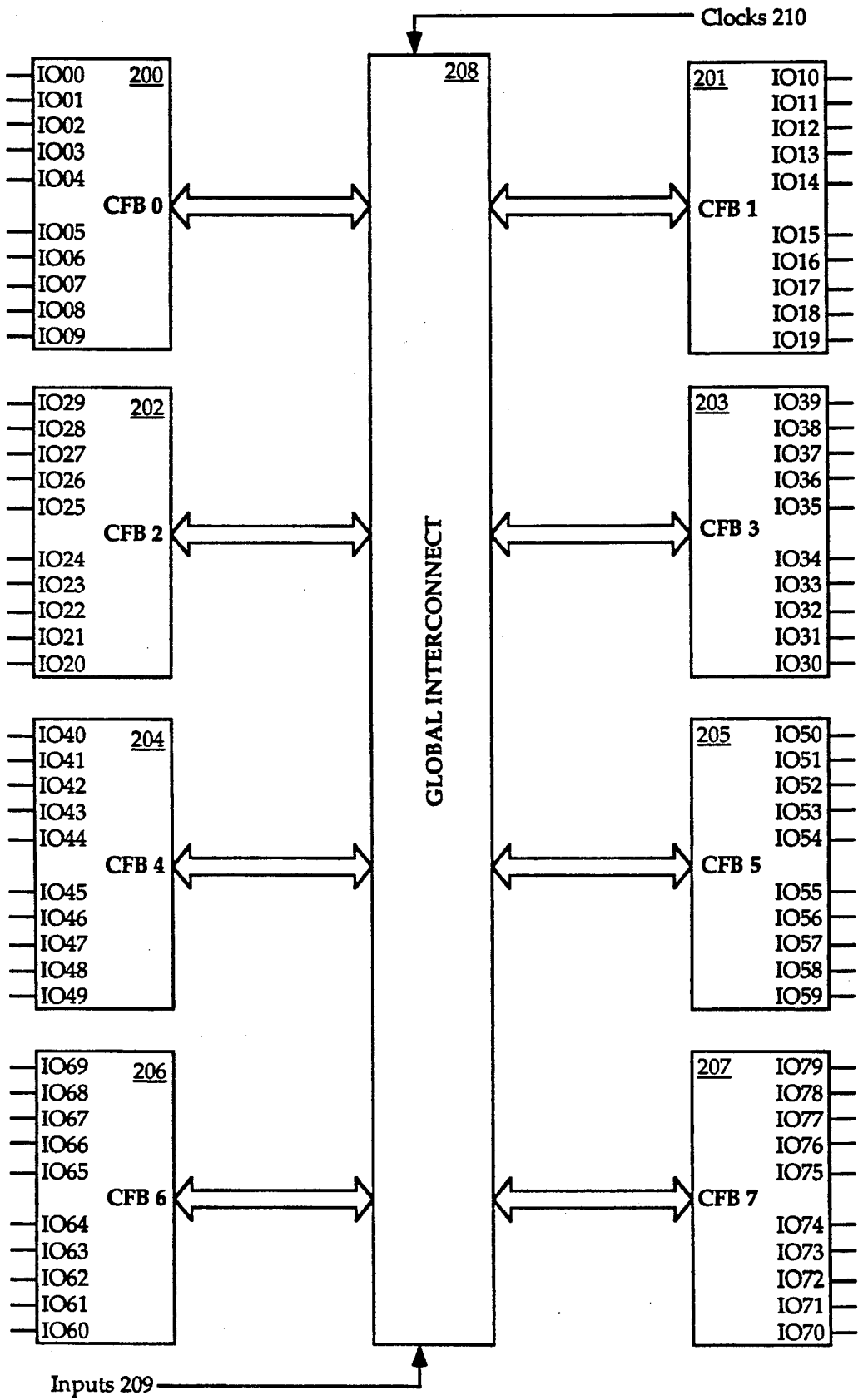
FIG. 2 is a block diagram illustrating a field programmable gate array upon which the present invention can be practiced.

FIG. 2 is a block diagram illustrating a field programmable gate array (FPGA) upon which the present invention can be practiced. The FPGA is comprised of eight configurable function blocks (CFBs) 200-207 coupled together by a global interconnect 208. Each of the CFBs is similar to a PAL. Data 209 and clock 210 lines are input to CFBs 200-207 via global interconnect 208. Global interconnect 208 is a bus having an interconnecting matrix which renders each of the CFB blocks connectable. Any combination of signals in the matrix can be routed to any CFB block, up to the maximum fan-in of the block. In the currently preferred embodiment, the maximum fan-in is twenty-four.

The CFBs 200-207 accept 24 bit wide inputs from global interconnect 208. Based on the inputs and the programmability up to ten outputs can be generated per CFB. In other words, 80 outputs 1000-1079 can be generated by the eight CFBs 200-207. This type of device is known as a 24V10, where the "V" connotes variable programming.

Figure 3:
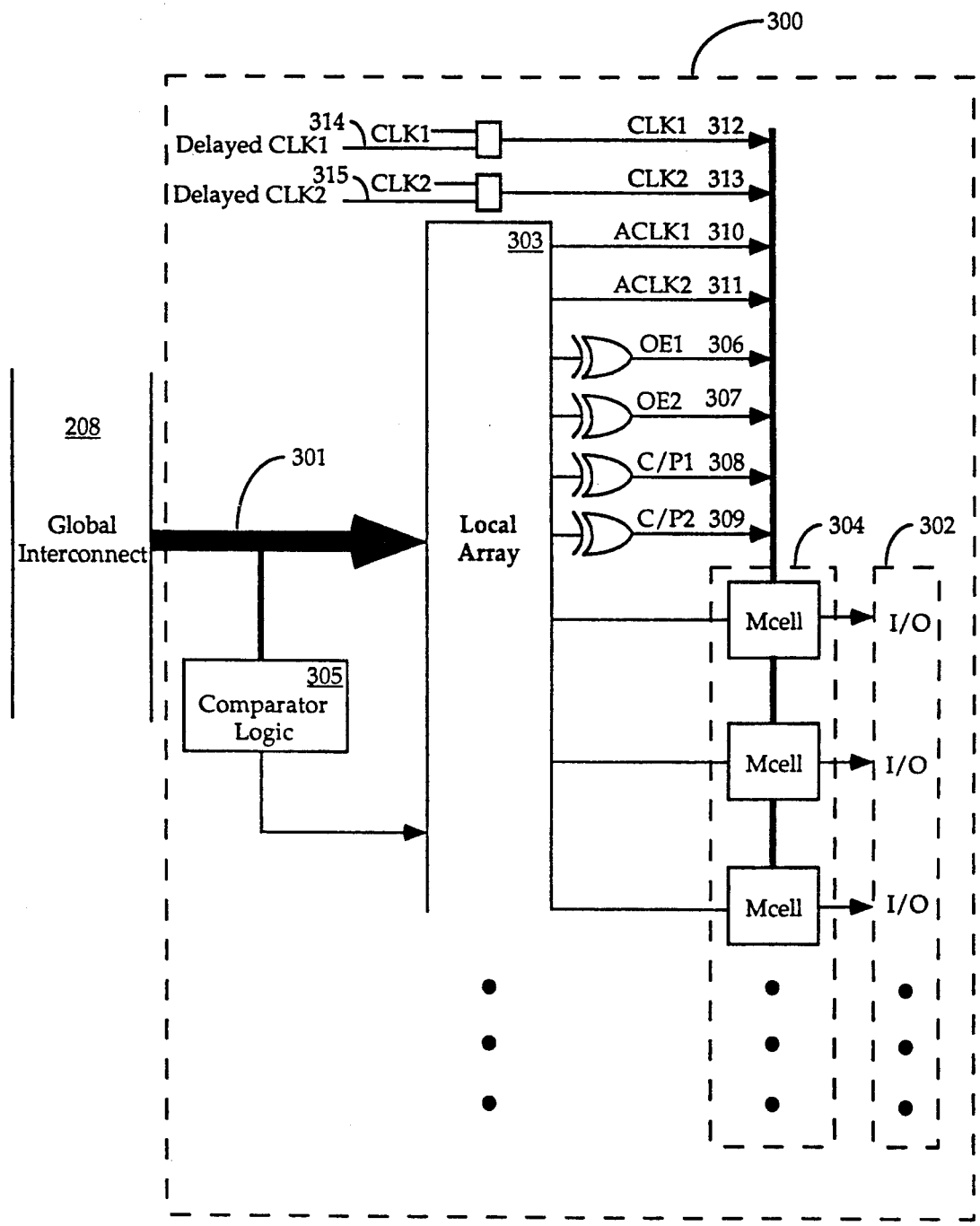
FIG. 3 is a block diagram illustrating a configurable function block of a field programmable gate array.

FIG. 3 is a block diagram illustrating a configurable function block 300. The CFB is comprised of a local array 303, ten programmable macrocells 304, comparator logic 305, four control signals 306-309, and four clock lines 310-313. There are 66 p-terms within a CFB. A user can program any combination of the 48 inputs (i.e., 24 inputs plus their complements) independently on all 66 of the p-terms. Six of the 66 p-terms are used as control and clock signals. The remaining 60 p-terms are distributed to the 10 outputs. Each output is driven by a macrocell. There are 10 macrocells in each CFB—one macrocell per output. Local array 303 is comprised of a programmable product term array and a p-term allocation circuit. The ten macrocells 304 can be programmed to function as an input as well as a combination, registered output, or bidirectional I/O. In the currently preferred embodiment, each CFB also has a programmable output polarity and programmable feedback options which allow greater flexibility in meeting target applications. The local array 303 and macrocells 304 will be described in detail below.

Comparator logic 305 can perform an identity compare of up to 12 bits. The number of bits that can be compared is limited by the fan-in of the CFB. Since the current fan-in is 24 signals, a 12 bit comparator is implemented. When less than 12 bits are being compared, the remaining available signals can be used in other logic equations. For instance, an 8-bit compare leaves 8 other signals on the block fan-in (i.e., 24−16=8). The bits being compared may also be used to implement sum-of-product (SOP) logic in parallel with the compare function. The output of comparator logic 305 can be allocated in place of a p-term set in one of the macrocells 304. Additionally, the comparator logic 305 has an invert option, and the macrocell has an open drain output option. By using the macrocell/comparator inversion controls along with the open drain output option, a user can implement Compare/AND, Compare/OR, or Compare/AND/OR logic.

The four control signals 306–309 associated with each CFB is comprised of two Output Enable (OE) signals 306–307 and two asynchronous Clear/Preset (C/P) signals 308–309. Each control signal is generated by a single p-term from the local block AND array. Each control signal also has an inversion option.

There are three clocking options available for each macrocell 304: synchronous, delayed, and asynchronous. Synchronous clock lines 312 and 313 are the standard clock modes, wherein the register clock is driven directly from the device clock pins. Delayed mode is similar to the synchronous mode, except that there is a delay which is added to the clock signal at the block level. The delay can be added to one or both of the synchronous clocks as indicated by delayed clock lines 314 and 315. In the asynchronous mode, the register clock utilizes one of the two block-level single product term asynchronous clock signals. There are two asynchronous clock lines 310 and 311.

Figure 4:
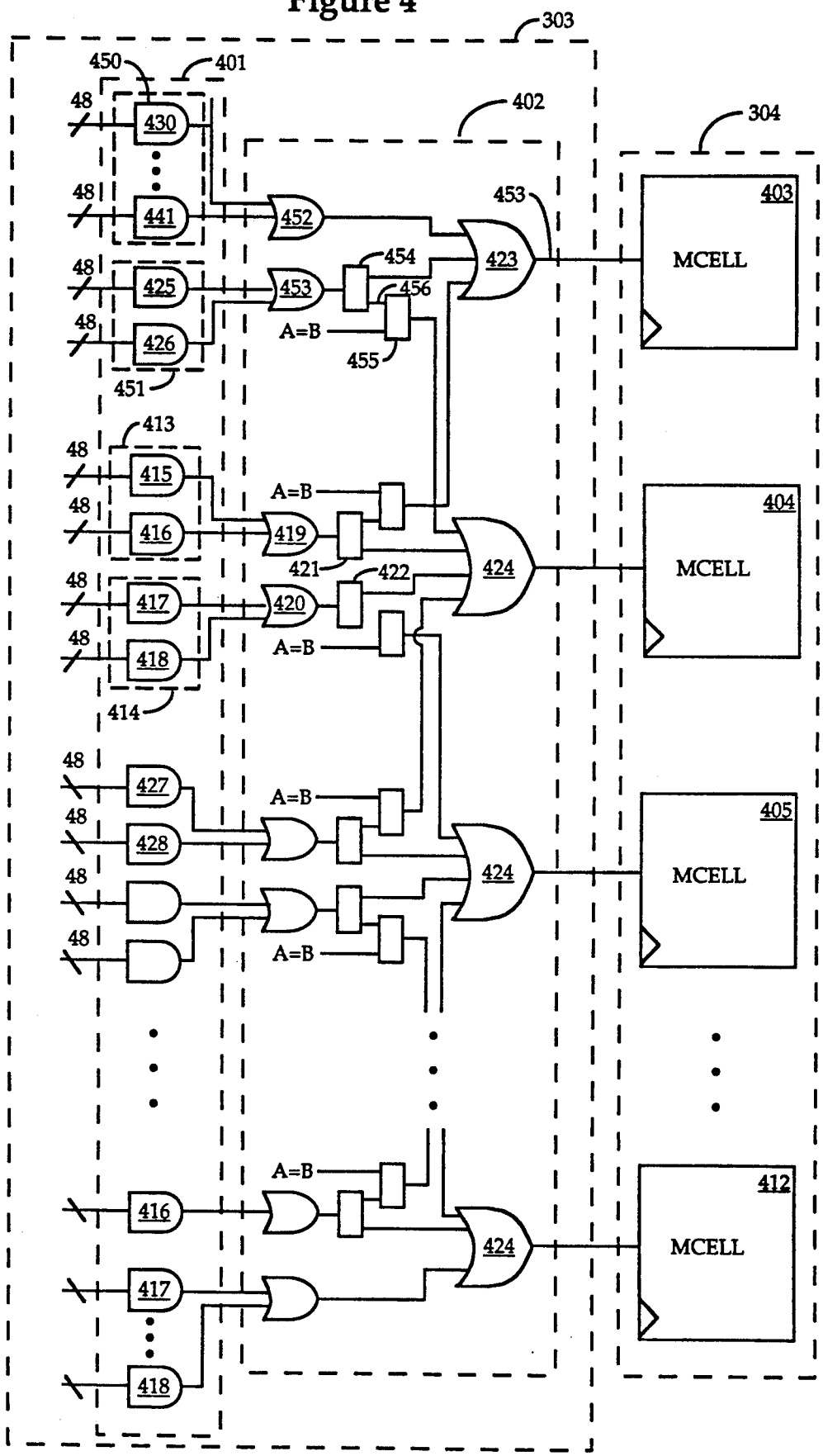
FIG. 4 is a block diagram illustrating a local array and macrocells of a field programmable gate array of the currently preferred embodiment of the present invention.

The local array 303 is now described in detail. FIG. 4 is a block diagram illustrating the local array 303 and ten macrocells 304. Local array 303 is comprised of a programmable AND array 401 followed by an OR array 402. Eight of the ten macrocells 404–411 have p-terms grouped into sets of two product terms each. The fourth through ninth macrocells are not shown, but they have the same structure as macrocells 404 and 405. They also have AND/OR arrays of the same configuration as described above. There are two p-term sets for each of the eight microcells. For example, macrocell 404 has, by default, two sets of p-terms, sets 413 and 414.

Each set is further comprised of two p-terms. Set 413 is comprised of a first p-term denoted by inputting 48 inputs to a first programmable AND gate 415 and a second p-term denoted by inputting 48 inputs to a second programmable AND gate 416. The 48 inputs originate from the 24 true and 24 complemented inputs from the global interconnect. Each of the programmable AND gates allows a user to AND together any combination of the 48 inputs (e.g., input 1 AND input $\overline{4}$ AND input 7, etc.). Similarly, p-term set 414 includes two programmable 48-bit input AND gates 417 and 418. The outputs from each of the p-term sets are input to an OR gate. For example, the two outputs from AND gates 415 and 416 are input to OR gate 419. Likewise, the two outputs from AND gates 417 and 418 are input to OR gate 420.

The outputs from each of the OR gates are input to a multiplexer. Referring to FIG. 4, the outputs from OR gates 419 and 420 are input to multiplexers 421 and 422, respectively. Each of the multiplexers is used to steer its inputted p-term to one of two adjacent macrocells. That is, multiplexer 421 can steer the OR function of two p-terms represented as the output of OR gate 419 to either macrocell 403 or macrocell 404. Likewise, multiplexer 422 can steer the p-terms from OR gate 420 to either macrocell 404 or to macrocell 405. In other words, each of the middle eight macrocells has the option of accepting two p-terms from both of its adjacent macrocells. Consequently, a user has the flexibility of having up to eight p-terms per macrocell. That is, four p-terms corresponding to that particular macrocell which are not steered to other macrocells are available, plus four additional p-terms can be steered from each of the two adjacent macrocells. For example, macrocell 404 can handle the four p-terms from AND gates 415–418 plus the two p-terms from AND gates 425–426 plus the two p-terms from AND gates 427–428, for a total of eight p-terms.

The advantage for implementing steerable p-terms is that after a user first designs a high-level circuit, the development software breaks the circuit down into a number of logic equations representing the circuit. The software assigns the equations to certain macrocells so that the p-terms are optimized. For example, if one equation requires six p-terms, it is placed next to an equation which only needs two p-terms. Thereby the two unused, extra p-terms associated with the macrocell which only needs two p-terms can be steered to the adjacent macrocell. Thereby, the six p-term equation can be implemented. The selection of which path the p-term is directed to is stored as bits in an SRAM. In other words, for each of the multiplexers, there is a corresponding bit of information (i.e., "1" or "0") which specifies whether the inputted p-term is to be passed through to the macrocell or to an adjacent macrocell. In an alternate embodiment, two SRAM bits could be used to allow the inputted p-term to be passed to either macrocell or to both macrocells. Once the p-terms have been properly steered, they are routed through a fixed OR gate before being input to the macrocells. The fixed OR gate completes the sum-of-products (SOP) function.

Referring back to FIG. 4, it can be seen that there is a different product term allocation scheme associated with the two end macrocells 403 and 412. There are two sets, 550 and 551, of p-terms associated with macrocell 403. The first set 450 of p-terms is comprised of 12 p-terms. Again, 48 inputs from the global interconnect are fed into separate AND gates. A total of twelve such AND gates 430–441 are used to generate twelve p-terms. The outputs from AND gates 430–441 are input to OR gate 452. The ORed p-terms are then directly input to OR gate 423 and eventually to macrocell 403. These p-terms cannot be steered to any of the other macrocells. They are hard-wired to the OR array.

The second set 451 of p-terms is comprised of two p-terms resulting from the two outputs of the 48-bit input AND gates 425 and 426. These two p-terms are ORed together by OR gate 453. The result is steered by multiplexer 454 to either macrocell 403 or macrocell 404. The product term allocation associated with macrocell 412 is the same as the one described above for macrocell 403. Thus, each of the two end macrocells can access an extra adjacent p-term set. This allows an increase of up to sixteen p-terms for macrocells 403 and 412.

In addition, there is also a second A=B multiplexer following each of the p-term steering multiplexers. Under the control of an additional SRAM bit, the A=B function may replace a p-term set in a given macrocell.

In short, the currently preferred embodiment of the present invention has a relatively low p-term average (i.e., six p-terms per macrocell). A user has the flexibility of steering unused p-terms to adjacent macrocells so that logic functions having up to eight p-terms can be implemented. Furthermore, a user has the capability of implementing up to sixteen p-terms. It should be noted that it takes approximately the same amount of time for the twelve pooled p-terms corresponding to the two end macrocells to propagate through the logic array 303 as the time taken for eight p-terms to propagate through logic array 303 to one of the eight middle macrocells. This is due to the fact that the signal path for the twelve p-terms is fixed, whereas the signal path for the eight p-terms involves passing through the multiplexing scheme for steering the extra p-terms to the appropriate macrocell.

Figure 5:
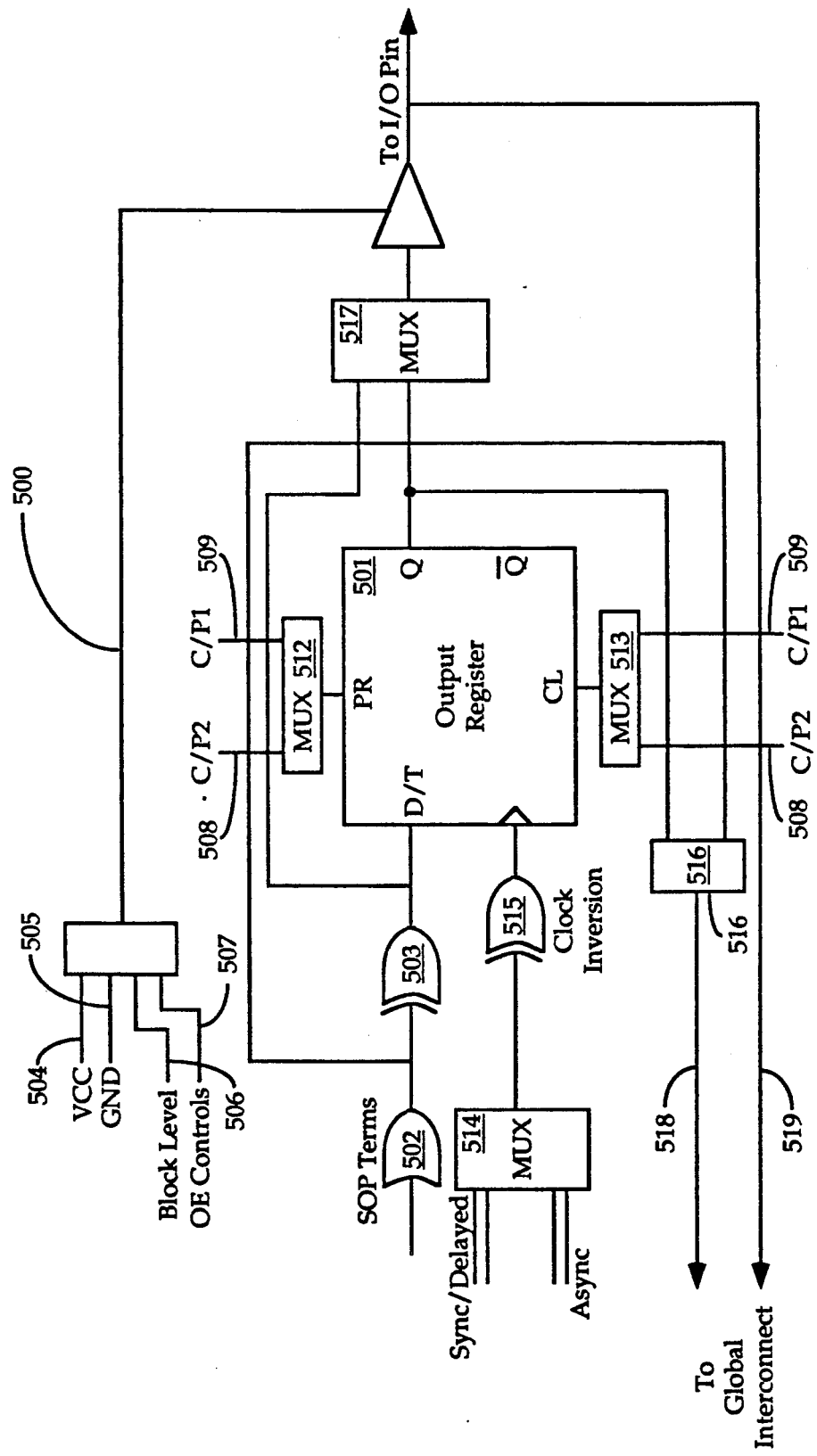
FIG. 5 is a block diagram illustrating a macrocell configuration.

FIG. 5 is a block diagram illustrating a macrocell 500 configuration. Macrocell 500 is comprised of an output register 501 which can be configured as either a combinatorial block, a D-register, or a Toggle flip-flop. The SOP terms from the logic array are fed into OR gate 502 and passed through XOR gate 503 to the output register 501. Multiplier 517 selects whether to send the output from the XOR gate 503 or the Q or $\overline{Q}$ output from register 501 to output buffer 518. $V_{cc}$ (i.e., the supply voltage for the device) and ground lines 504–505 are provided for each macrocell. Furthermore, the block level output enable (OE) controls 506 and 507 specify three state buffering operations. The $V_{cc}$ option specifies an output operation, while the $V_{ss}$ option specifies an input operation.

Macrocell 500 has dual feedback paths 518 and 519 coupled back to the global interconnect. One feedback path 518 is internal, whereas the other feedback path 519 is coupled to an I/O pin. This feature allows I/O pins being used for buried logic to also be used as inputs. These I/Os may still be used to provide buried logic, since internal feedback is available. Multiplexer 516 selects whether to put the SOP terms or the Q output from register 501 onto internal feedback line 518.

Output register 501 can be cleared or preset using global clear and preset p-terms via the Clear and Preset lines 508–509. Multiplexers 512 and 513 select which of the two C/P signals are used. Multiplexer 514 selects whether one of the synchronous/delayed or asynchronous clock is used to clock output register 501. The clocked output is fed into XOR gate 515 before being used as a clock input to output register 501. XOR gate 515 provides a clock invert option which allows output register 501 to be independently clocked on either the rising or falling edge of the global clock.

The PLD is programmed according to a specification provided by a circuit designer. A piece of hardware, known as a programmer, is coupled to a microcomputer. A piece of software takes the specification and automatically determines which of the corresponding non-volatile memory bits are to be programmed to achieve the desired logic function. The software also performs minimization tasks, wherein complex logic equations are reduced to equivalent but more simplified equations. It is this software which also decides how to allocate the p-terms in the various CFBs for optimizing efficiency.

Figure 6:
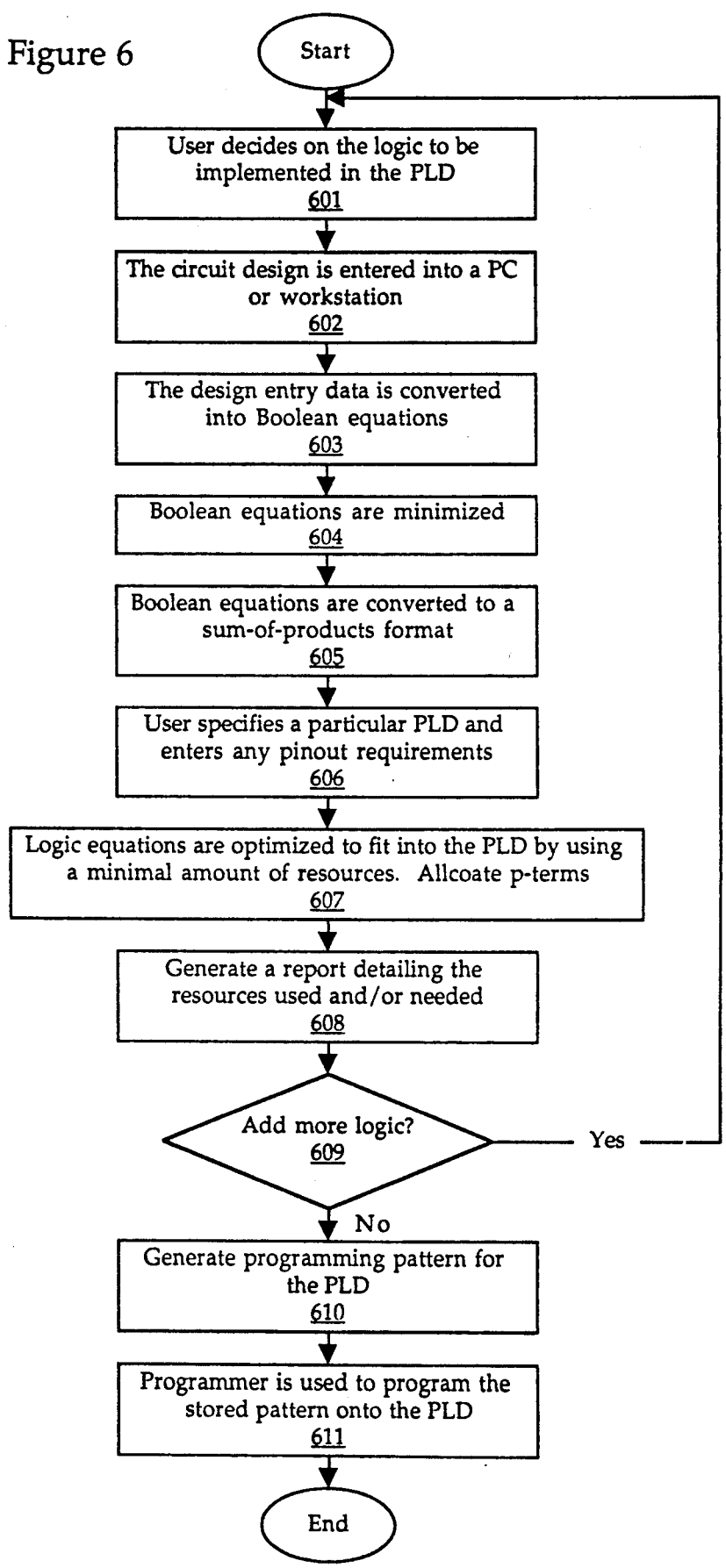
FIG. 6 is a flow chart illustrating the steps in a design process for PLDs.

FIG. 6 is a flowchart illustrating the steps in a design process for PLDs. First, the user decides on the desired logic to be implemented in the PLD, step 601. The circuit design is entered into a personal computer or workstation, step 602. The design entry can be accomplished by the following methods: 1) schematic capture—a mouse or some other graphic input device is used to input schematics embodying the logic, 2) net list entry—a user enters the design to the computer by describing the symbols and interconnections in words via a standardized format (i.e., a net list), 3) state equation/diagram—entry of a sequential design involving states and transitions between states (equations or a state table can also be used to define a state machine), and 4) Boolean equations which involves expressing the logic in terms of Boolean algebraic equations.

Next, the software converts all design entry data into Boolean equations (if necessary), step 603. The Boolean equations are converted to a sum-of-products (SOP) format after logic reduction, steps 604 and 605. The logic is minimized through heuristic algorithms. The user can specify the particular PLD for the design to be implemented and any pinout requirements, step 606. The software optimizes the logic equations to fit into the device, using the minimum amount of resources (e.g., I/O pins, registers, product terms, macrocells, etc.), step 607. This optimization step is where the product terms are allocated (i.e., assigned to a particular macrocell). A detailed report describing the resources used in fitting the design on the PLD is generated, step 608. This allows a user to incrementally stuff in logic if there is availability, step 609. In addition, if the design overflowed the PLD (i.e., the chosen PLD does not have the resources required to implement the design), a list of the resources needed to complete the design is generated. A user can choose a larger PLD or partition the initial design into two different PLDs. The appropriate program pattern for the PLD is generated, step 610. A programmer is used to program the stored pattern onto the PLD, step 611.

Thus, a product term allocation scheme in a programmable logic device is disclosed.

What is claimed is:

1. In a field programmable gate array chip having a plurality of gates capable of being programmed according to a plurality of product terms for performing a particular logic function, an input means for inputting a signal, a means for processing said signal according to said logic function, a plurality of output means for outputting said signal after said signal has been processed, an apparatus for allocating said plurality of product terms to said plurality of output means comprising:

a means for selecting one of said plurality of output means;

a means for steering at least one of said product terms to a selected output means;

a means for assigning a number of said product terms to a particular predetermined output means, wherein a maximum number of product terms assignable to said particular predetermined output means is more than twice an average number of product terms available for one of said output means.

2. The apparatus of claim 1 further comprising:
a plurality of AND gates coupled to said input means which can be programmed to perform AND functions on said signals according to said product terms;
a plurality of OR gates coupled to said plurality of AND gates for performing OR functions on said signals after said signals have been processed by said AND gates.

3. The apparatus of claim 2, wherein said output means are comprised of macrocells.

4. The apparatus of claim 3, wherein said selecting means is a multiplexer.

5. The apparatus of claim 4 further comprising at least two feedback means coupled to said AND array, wherein one feedback means originates internal to said macrocell and another feedback means originates from an input/output pin.

6. A programmable logic circuit comprising:
a plurality of programmable AND gates for implementing a plurality of product terms representing logic functions of a digital circuit;
a plurality of OR gates for implementing sum of products;
a plurality of programmable macrocells for outputting said sum of products;
a product term allocation means for directing a first set of product terms to one of at least two adjacent macrocells, wherein at least one of said plurality of macrocells has a second set of product terms permanently assigned to said macrocell, said number of product terms in said second set is greater than a number of product terms in said first set; and
wherein said first set is comprised of at least two product terms and said second set is comprised of at least twelve product terms.

7. The programmable logic circuit of claim 6, wherein each of said configurable logic blocks is comprised of ten macrocells, at least one of said macrocells includes one of said first set and one of said second set of product terms.

8. The programmable logic circuit of claim 7, wherein said product term allocation means is comprised of a multiplexer.

9. The programmable logic circuit of claim 8, wherein said multiplexer is controlled by a programmable bit stored in a memory means.

10. The programmable logic circuit of claim 9, wherein said macrocell is configured to a combination block.

11. The programmable logic circuit of claim 10, wherein said macrocell is configured to a D-register.

12. The programmable logic circuit of claim 11, wherein said macrocell is configured to a toggle flip-flop.

13. In a programmable logic device having a plurality of AND gates for implementing a plurality of product terms representing logic functions, a plurality of OR gates for implementing sums of products, a plurality of macrocells for outputting said sums of products, a method of allocating said product terms to said macrocells comprising the steps of:
providing a first set of product terms permanently assigned to one of said macrocells;
providing a second set of product terms which can be directed to one of at least two of said plurality of macrocells, wherein said second set is comprised of less product terms than said first set;
selecting said one of at least two of said plurality of macrocells;
directing said second set of product terms to said selected macrocells;
implementing a multiplexer to control said selecting step;
feeding back signals internal to said macrocells and signals on input/output pins to said AND gates; and implementing at least twelve product terms for said first set and at least two product terms for said second set.

14. The method of claim 13, wherein sixteen product terms are available to said selected macrocell.

15. The method of claim 14, wherein said product terms are simultaneously steered to multiple macrocells.

16. A computer system having a programmable logic, comprising:
a plurality of programmable AND gates for implementing a plurality of product terms representing a plurality of logic equations;
a plurality of OR gates for implementing sums of products;
a plurality of macrocells for outputting said sums of products;
a product allocation means, wherein at least sixteen product terms are assigned to one of said macrocells and said programmable logic device is comprised of an average of six product terms per macrocell.

17. The computer system of claim 16 is further comprised of a means for directing a product term to a particular macrocell.

18. The computer system of claim 17, wherein said directing means is comprised of a multiplexer.

19. The computer system of claim 18, wherein said multiplexer is controlled by a programmable bit stored in a memory means.

20. The computer system of claim 19 is further comprised of a means for steering said product term to a plurality of macrocells simultaneously.

* * * * *